(12) United States Patent
Alhayed et al.

(10) Patent No.: US 8,373,266 B2
(45) Date of Patent: Feb. 12, 2013

(54) HEAT SINK MOUNTED ON A VEHICLE-TRANSMISSION CASE

(75) Inventors: Iyad Alhayed, Schaumburg, IL (US); Gerry Bianco, Elgin, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 610 days.

(21) Appl. No.: 11/693,280

(22) Filed: Mar. 29, 2007

(65) Prior Publication Data
US 2008/0236782 A1 Oct. 2, 2008

(51) Int. Cl.
*H01L 23/36* (2006.01)
(52) U.S. Cl. .......... 257/706; 257/E21.499; 438/122
(58) Field of Classification Search .......... 257/706, 257/712, E21.499; 438/109, 122
See application file for complete search history.

(56) References Cited

U.S. PATENT DOCUMENTS

| | | | |
|---|---|---|---|
| 4,620,264 A | 10/1986 | Ushifusa | |
| 5,481,268 A * | 1/1996 | Higgins | 342/70 |
| 5,585,671 A * | 12/1996 | Nagesh et al. | 257/697 |
| 5,614,883 A | 3/1997 | Dery et al. | |
| 5,751,063 A * | 5/1998 | Baba | 257/723 |
| 6,078,502 A * | 6/2000 | Rostoker et al. | 361/723 |
| 6,193,564 B1 | 2/2001 | Loibl et al. | |
| 6,607,942 B1 * | 8/2003 | Tsao et al. | 438/122 |
| 6,678,167 B1 * | 1/2004 | Degani et al. | 361/760 |
| 6,933,603 B2 | 8/2005 | Chen | |
| 6,972,243 B2 | 12/2005 | Patel | |
| 7,067,392 B2 | 6/2006 | Yamazaki | |
| 7,115,988 B1 * | 10/2006 | Hool | 257/713 |
| 7,396,700 B2 * | 7/2008 | Hsu | 438/107 |
| 7,728,440 B2 * | 6/2010 | Honda | 257/778 |
| 7,829,992 B2 * | 11/2010 | Sugino et al. | 257/686 |
| 7,880,296 B2 * | 2/2011 | Wong et al. | 257/700 |
| 2002/0113662 A1 | 8/2002 | Rathore et al. | |
| 2003/0176020 A1 * | 9/2003 | Tsao et al. | 438/122 |
| 2004/0070462 A1 | 4/2004 | Alhayek et al. | |
| 2004/0238946 A1 * | 12/2004 | Tachibana et al. | 257/706 |
| 2005/0083626 A1 * | 4/2005 | Bruwer | 361/93.1 |
| 2005/0133906 A1 * | 6/2005 | Woodall et al. | 257/707 |
| 2005/0199998 A1 * | 9/2005 | Chen et al. | 257/706 |
| 2005/0256241 A1 | 11/2005 | Sachdev et al. | |
| 2006/0055028 A1 * | 3/2006 | Hasunuma | 257/706 |
| 2006/0231944 A1 * | 10/2006 | Huang et al. | 257/706 |
| 2007/0008679 A1 * | 1/2007 | Takahasi et al. | 361/600 |
| 2007/0018310 A1 * | 1/2007 | Sato | 257/706 |
| 2007/0040267 A1 * | 2/2007 | Zhao et al. | 257/706 |
| 2007/0069371 A1 * | 3/2007 | Iksan et al. | 257/706 |
| 2007/0087478 A1 * | 4/2007 | Tao et al. | 438/106 |
| 2007/0145571 A1 * | 6/2007 | Lee et al. | 257/706 |
| 2009/0200660 A1 * | 8/2009 | Awad et al. | 257/704 |
| 2010/0225363 A1 * | 9/2010 | Takahashi et al. | 327/109 |

OTHER PUBLICATIONS

International Search Report dated Jul. 31, 2008, from corresponding International Patent Application No. PCT/US2008/058597.

* cited by examiner

*Primary Examiner* — Nathan Ha

(57) ABSTRACT

A system for dissipating heat from a semiconductor board includes a first substrate including an opening formed therein, a second substrate attached to a surface of the first substrate, and a microchip positioned in the opening and bumped to the second substrate. The system further includes a heat sink directly adhered to the microchip. A method of manufacturing a heat dissipating semiconductor board includes forming an opening in a first substrate and positioning a microchip in the opening. The method further includes directly adhering the microchip to a heat sink, bonding the microchip to a second substrate and boding a surface of the first substrate to the second substrate.

16 Claims, 5 Drawing Sheets

HEAT SINK MOUNTED ON A VEHICLE-TRANSMISSION CASE

TECHNICAL FIELD OF THE INVENTION

The present invention related generally to thermal dissipation from microchips and in particular to thermal dissipation in chip substrates.

BACKGROUND OF THE INVENTION

Heat generation is an undesired byproduct of operating microchips. Typically, excess heat flows to a heat sink through thermal vias and wire bonds. However, as wiring systems become more complex, designers are increasingly being challenged to place the thermal vias, especially in applications with limited space. These problems are exacerbated in high temperature operating environments. While simple components such as FETS, diodes and low power integrated chips (IC) have solutions, problems exist for high pincount devices such as microchips, flash memory, SRAM, etc.

Thus, in automotive engine applications, such as automotive transmissions, designers face a daunting challenge. In such an environment, often approaching 140 Celsius, the maximum operating temperature can be as low as 150 Celsius, leaving a window of only 10 Celsius. While cooling systems can help alleviate these problems, such systems add both cost, as well as weight, to the system, and can therefore be undesirable.

FIG. 1 illustrates a prior art circuit board 100 including substrate 105. A plurality of flip chips. IC's and other electronic devices 140 are mounted to substrate 105 using appropriate techniques. In addition, microchip 110 is wirebonded 120 to the substrate, with wirebond 120 providing at least some heat sink functionality for microchip 110. As can be seen in FIG. 1, microchip 110 includes a significant footprint on the substrate 105, especially when including the wirebond 120.

Therefore, it would be desirable to provide a system for dissipating heat that would overcome the aforementioned and other disadvantages.

SUMMARY OF THE INVENTION

One aspect of the invention provides a system for dissipating heat from a semiconductor board includes a first substrate including an opening formed therein, a second substrate attached to an upper surface of the first substrate, and a microchip positioned in the opening and bumped to the second substrate. The system further includes a heat sink directly adhered to the microchip.

Another aspect of the invention provides method of manufacturing a heat dissipating semiconductor board includes forming an opening in a first substrate and positioning a microchip in the opening. The method further includes directly adhering the microchip to a heat sink, bonding the microchip to a second substrate and bonding a surface of the first substrate to the second substrate.

Yet another aspect of the invention provides a system for dissipating heat from a semiconductor board includes a first substrate including an opening formed therein, a second substrate attached to an upper surface of the first substrate, and a microchip positioned in the opening and bumped to the second substrate. The system further includes a mean for directly adhering a microchip to the heat sink.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DETAILED DESCRIPTION OF THE PRESENTLY PREFERRED EMBODIMENTS

Figure 2:
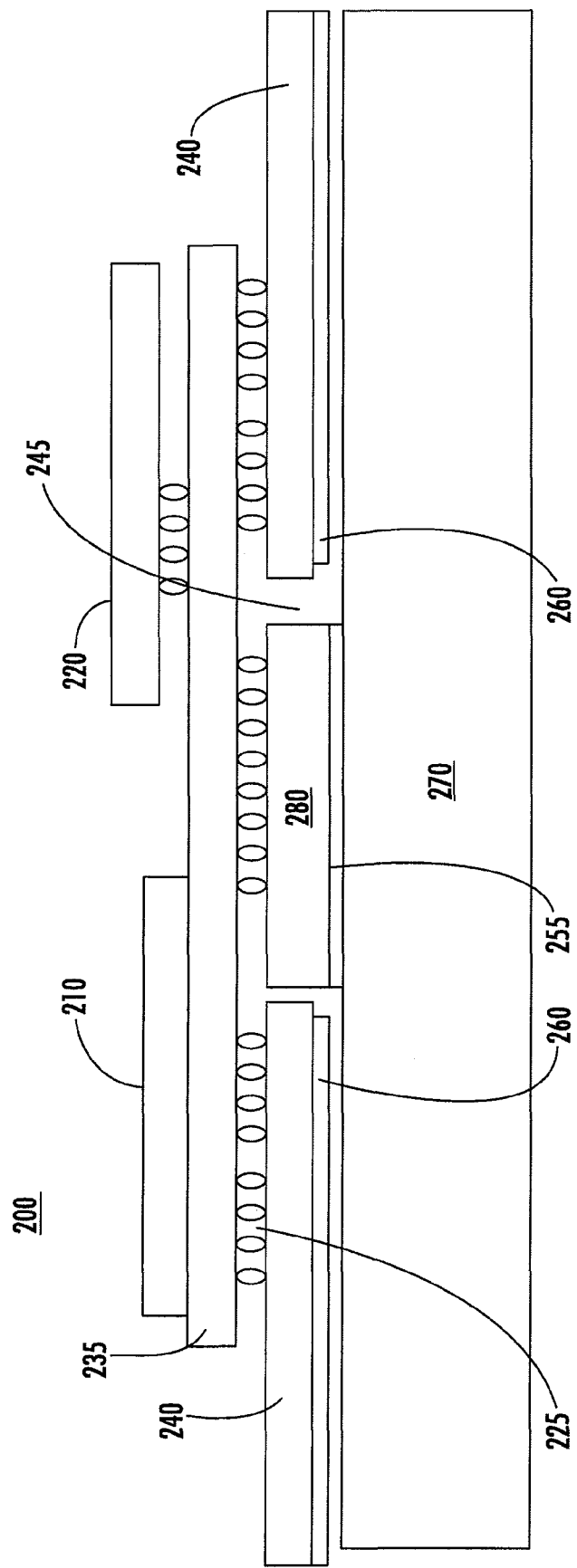
FIG. 2 illustrates an embodiment of a system for thermal dissipation, in accordance with an aspect of the invention.

FIG. 2 illustrates one embodiment of a system 200 for thermal dissipation in accordance with one aspect of the invention. System 200 includes heat sink 270, microchip 280 and first substrate 240. First substrate 240 includes an opening 245 formed within first substrate 240. Microchip 280 and first substrate 240 are bumped to second substrate 235 with bumps 225. First substrate 240 can be a low density ceramic board or a Flame Resistant 4 ("FR-4") board, among other appropriate structures. Second substrate 235 can be a High Density Interconnection ("HDI") board, Low Temperature Co-fired Ceramic ("LTCC") board, or a ceramic board, among other appropriate structures. Alternatively, the first substrate and second substrate can be the same type of board, such as HDI, LTCC, Fr-4, ceramic, low density ceramic, or the like.

Additionally, at least one electronic device, such as integrated chip 210 and flip chip 220 can be operatively attached to second substrate 235. Operative attachment can be made by any appropriate joining technique, such as bumping, soldering, or a direct connection. Any appropriate material can be used for bumping in accordance with this disclosure, including gold and solder. In one embodiment, at least one chip is bumped to the second substrate on a first side of the second substrate, and the microchip is bumped to the second substrate on a second side of the second substrate, with the first side opposing the second side. In such embodiments, the chips and microchip are mounted to opposing sides of the second substrate, such that the microchip can be directly mounted to the heat sink with a high thermal conductivity adhesive. Any appropriate devices can be used to bump, such as the K&S WaferPro III Stud Bumper. Chips can be bonded to the first substrate or second substrate with the UltraSonic FCX501 FlipChip Bonder, available from Panasonic.

Figure 6:
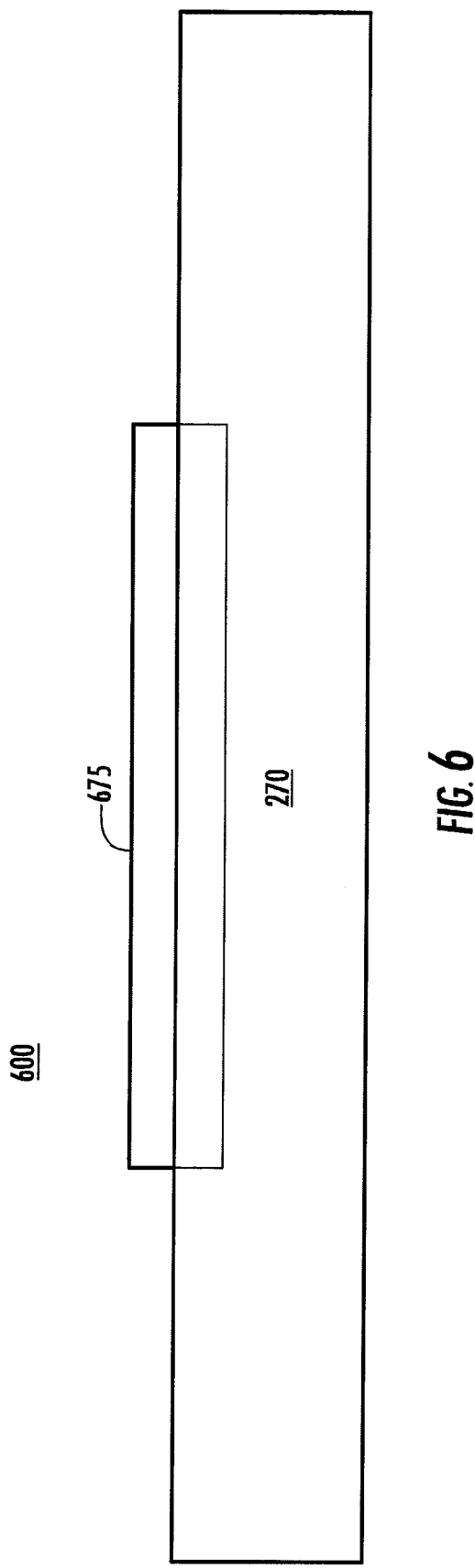
FIG. 6 illustrates an embodiment of a heat sink for thermal dissipation, in accordance with an aspect of the invention.

Heat sink 270 is any structure to which heat will flow from the operative electronic components such as chips 210, 220 and microchip 280. In one embodiment, heat sink 270 is a structure made of aluminum. In one embodiment, heat sink 270 is a transmission case. In another embodiment, heat sink 270 is directly attached to a transmission case. In one embodiment, heat sink 270 includes at least one ridge sized to fit within opening 245. FIG. 6 illustrates ridge 675 on heat sink 270. In other embodiment, heat sink 270 includes fins or other physical characteristics to increase surface area or improve heat flow.

In one embodiment, first substrate 240 is isolated from heat sink 270 by a low thermal conductivity adhesive 260, such as an adhesive with a thermal conductivity of less than approximately 0.9 W/m-K. In one embodiment, heat sink 270 is directly adhered to microchip 280 with a high thermal conductivity adhesive 255, wherein the high thermal conductivity adhesive 255 conducts greater than approximately 2.5 W/m-K.

Figure 3:
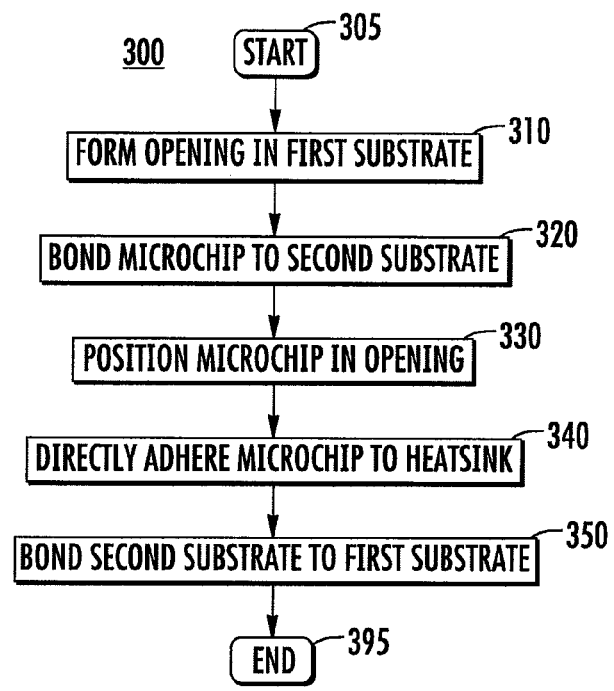
FIG. 3 illustrates one embodiment of a method for manufacturing a heat dissipating semiconductor board, in accordance with one aspect of the invention.

FIG. 3 illustrates one embodiment of a method 300 for manufacturing a heat dissipating semiconductor board, in accordance with one aspect of the invention. Method 300 begins at 305.

At step 310, method 300 forms an opening, such as opening 245, in a first substrate, such as first substrate 240. The opening can be substantially circular, polygonal, or any other appropriate shape. In one embodiment, the opening is sized to accommodate a microchip. In one embodiment, the opening is sized to accommodate a microchip with a gap between the microchip and the first substrate. In some embodiments, the gap can be filled with underfill, depending on design. The opening can be created by dicing the substrate, or by attaching a plurality of substrates together to define the opening. A microchip is bonded to the second substrate at step 320 and the microchip is positioned in the opening at step 330. The microchip is then directly adhered to a heat sink at step 340. In one embodiment, a high thermal conductivity adhesive adheres the microchip to the heat sink. The second substrate is bonded to the first substrate at step 350. Method 300 ends at step 395.

Figure 4:
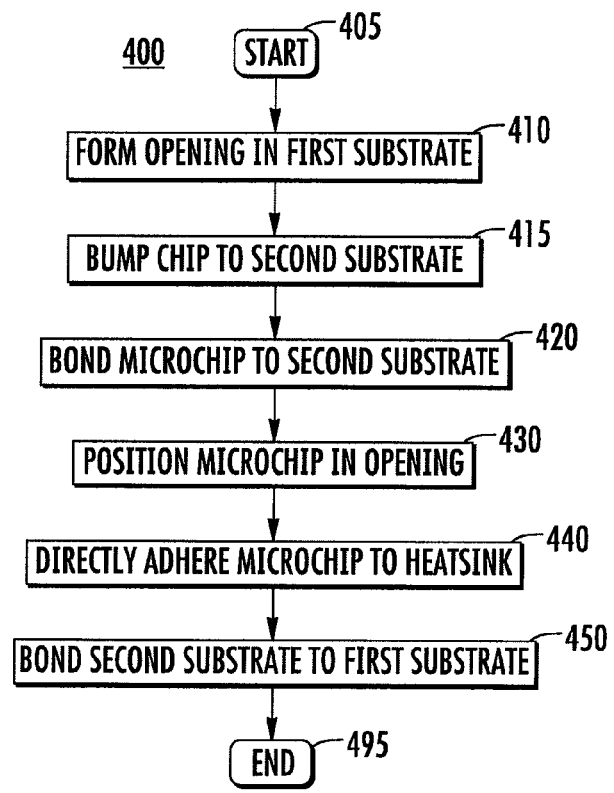
FIG. 4 illustrates one embodiment of a method for manufacturing a heat dissipating semiconductor board, in accordance with one aspect of the invention.

FIG. 4 illustrates one embodiment of a method 400 for manufacturing a heat dissipating semiconductor board, in accordance with one aspect of the invention. Method 400 begins at 405.

At step 410, method 400 forms an opening, such as opening 245, in a first substrate, such as first substrate 240. The opening can be substantially circular, polygonal, or any other appropriate shape. In one embodiment, the opening is sized to accommodate a microchip. In one embodiment, the opening is sized to accommodate a microchip with a gap between the microchip and the first substrate. In some embodiments, the gap can be filled with underfill, depending on design. The opening can be created by dicing the substrate, or by attaching a plurality of substrates together to define the opening. A microchip is bonded to the second substrate at step 420 and the microchip is positioned in the opening at step 430. The microchip is then directly adhered to a heat sink at step 440. In one embodiment, a high thermal conductivity adhesive adheres the microchip to the heat sink. The second substrate is bonded to the first substrate at step 450.

At least one chip is bumped to the second substrate at step 415. The chip is bumped to a first side of the second substrate (such as the top side) while the microchip is bumped to a second side of the second substrate (such as the bottom side), and the first side of the second substrate opposes the second side of the second substrate.

Method 400 ends at step 495.

Use of this disclosure enables both improved heat flow from the microchip to the heat sink, and also design of bare dies to be mounted on LTCC boards. Removal of heat spreaders saves both space and cost. Higher power items like a microprocessor, would be stud bumped to the bottom of a small HDI/LTCC board and the die would be thermally attached to the baseplate with high conductivity adhesive. Lower power components, such as IC's and flip chips can be attached to the top of the small substrate, with thermal vias for heat transfer as needed. This keeps the bottom available for signal I/O balls and allows the substrate to remain small. Higher density is achieved by using IC's as flip chips on both sides of the board, and solder balls, would be the interconnect to the large substrate, similar to a BGA.

In addition to functional advantages, the disclosure herein can contribute to cost advantages as well. For example, high density routing is primarily on the second substrate, so that the larger substrate, i.e. first substrate 240 can be a simpler and less costly design. Replacing gold wirebonding with gold stud bumping will reduce costs due to less material and higher throughput and no outsourced flip chip logistical issues.

Figure 1:
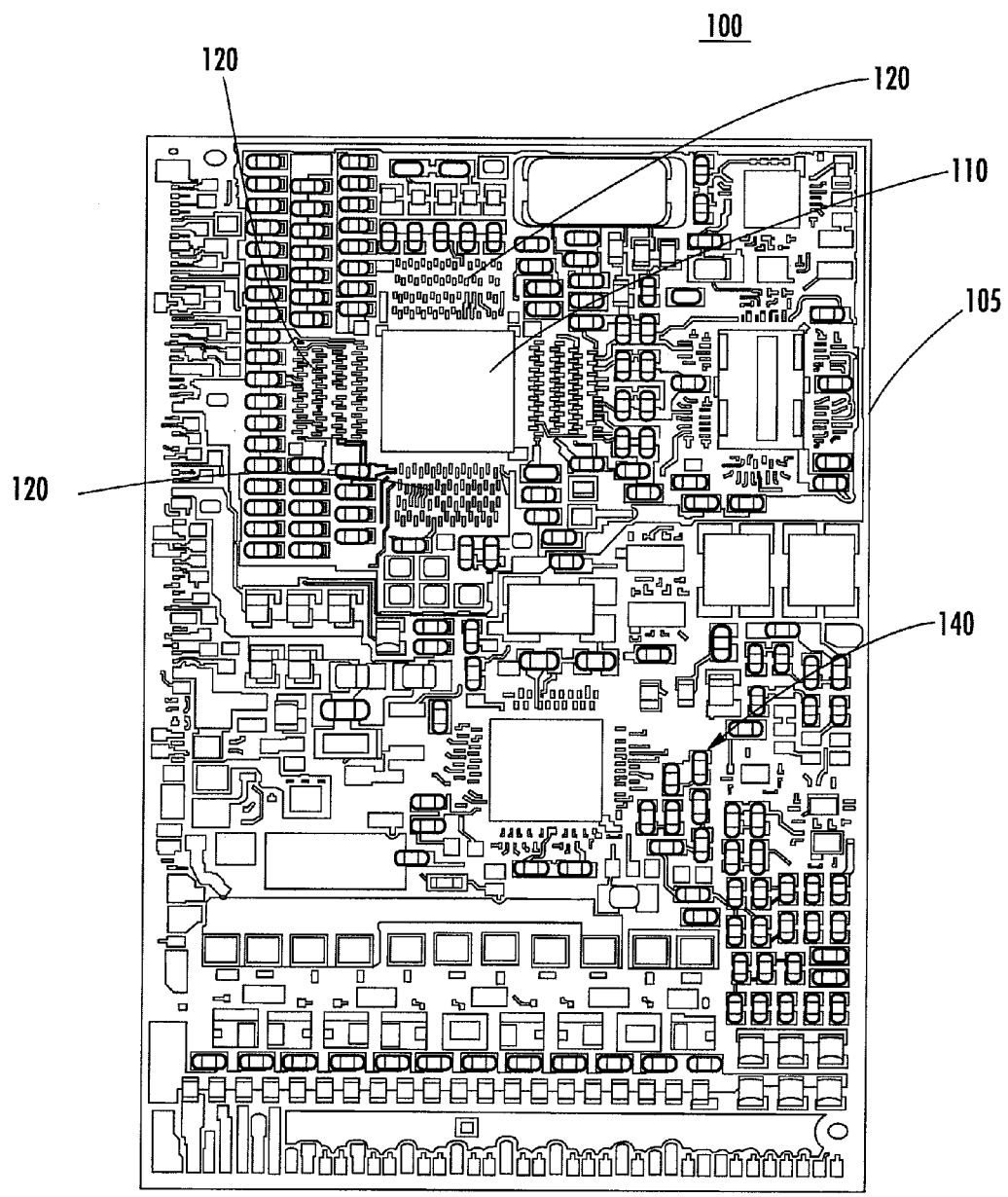
FIG. 1 illustrates one embodiment of a first substrate in accordance with the prior art.
Figure 5:
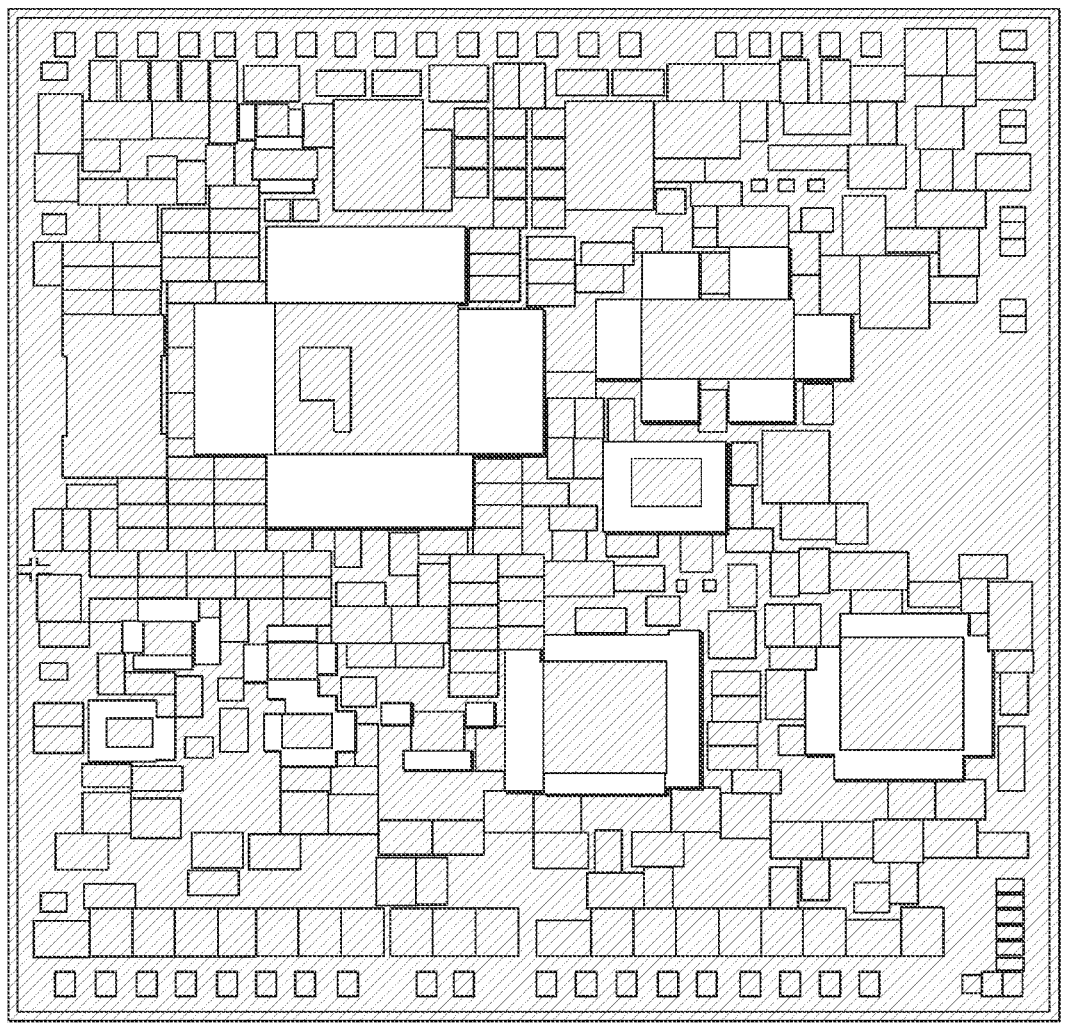
FIG. 5 illustrates one example of space saved on a board, in accordance with the teachings of the invention.

For example, an application of the teaching to the board depicted in FIG. 1 could result in a board space savings of 0.532 in$^2$ out of 4.58 in$^2$, FIG. 5 illustrates another board featuring significant space savings, wherein the white areas 502 represent saved space from the lack of wirebonding surrounding the wirebonded microchip.

While the teachings of this disclosure are applicable in any operating environment, it is anticipated that one operating environment is automotive, especially in a transmission or engine controller. Thus, the microchip can be a chip including instructions for operating a transmission. Alternatively, the microchip can be a chip including instructions for operating an engine.

It is important to note that the figures and description illustrate specific applications and embodiments of the present invention, and is not intended to limit the scope of the present disclosure or claims to that which is presented therein. Upon reading the specification and reviewing the drawings hereof, it will become immediately obvious to those skilled in the art that myriad other embodiments of the present invention are possible, and that such embodiments are contemplated and fall within the scope of the presently claimed invention.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A system for dissipating heat from a semiconductor board, comprising:
    a first substrate including an opening formed therein;
    a second substrate attached to a surface of the first substrate;
    a microchip positioned in the opening and bumped to the second substrate;
    a heat sink directly adhered to the microchip;
    a transmission case, and the heat sink is integral with the transmission case; and
    at least one ridge formed as part of the heat sink, the at least one ridge sized to fit within the opening.

2. The system of claim 1 wherein the first substrate is FR-4 board.

3. The system of claim 1 wherein the first substrate is a low density ceramic board.

4. The system of claim 1 wherein the second substrate is a HDI board.

5. The system of claim 1 wherein the second substrate is a Low Temperature Co-fired Ceramic board.

6. The system of claim 1 wherein the second substrate is a ceramic board.

7. The system of claim 1 wherein the heat sink adheres to the microchip with a high thermal conductivity adhesive, wherein the high thermal conductivity adhesive has a conductivity greater than 2.5 W/m-K.

8. The system of claim 1 further comprising at least one chip bumped to the second substrate, wherein the at least one chip is bumped to the second substrate on a first side of the second substrate, and wherein the microchip is bumped to the second substrate on a second side of the second substrate, and wherein the first side of the second substrate opposes the second side of the second substrate.

9. The system of claim 1 wherein the heat sink adheres to the first substrate with a low thermal conductivity adhesive, wherein the low conductivity adhesive has a conductivity less than 0.9 W/m-K.

10. The system of claim 1 wherein the bumps are gold bumps.

11. The system of claim 1 wherein the bumps are solder bumps.

12. The system of claim 1 wherein the microchip includes instructions for operating a transmission.

13. The system of claim 1 wherein the microchip includes instructions for operating an engine.

14. A method of manufacturing a heat dissipating semiconductor board, the method comprising:
forming an opening in a first substrate;
bonding a microchip to a second substrate;
positioning the microchip in the opening;
directly adhering the microchip to a heat sink;
bonding a surface of the first substrate to the second substrate;
mounting the heat sink on a transmission case, the heat sink having at least one ridge sized to fit within the opening.

15. The method of claim 14 further comprising:
bumping at least one chip to the second substrate, wherein the at least one chip is bumped to the second substrate on a first side of the second substrate, and wherein the microchip is bumped to the second substrate on a second side of the second substrate, and wherein the first side of the second substrate opposes the second side of the second substrate.

16. A system for dissipating heat from a semiconductor board, comprising:
a first substrate including an opening formed therein;
a second substrate attached to an upper surface of the first substrate;
a microchip positioned in the opening and bumped to the second substrate;
means for adhering a heat sink directly to the microchip; and
means for mounting the heat sink on a transmission case, such that at least one ridge formed as part of the heat sink is sized to fit within the opening.

* * * * *

UNITED STATES PATENT AND TRADEMARK OFFICE
CERTIFICATE OF CORRECTION

| | | |
|---|---|---|
| PATENT NO. | : 8,373,266 B2 | Page 1 of 1 |
| APPLICATION NO. | : 11/693280 | |
| DATED | : February 12, 2013 | |
| INVENTOR(S) | : Iyad Alhayek et al. | |

It is certified that error appears in the above-identified patent and that said Letters Patent is hereby corrected as shown below:

On the Title page, Item (12) under Untied States Patent the inventors name should read--

Alhayek et. al.

On the Title page, Item (75) under Inventors, the inventors should read--

Iyad Alhayek, Schaumburg, IL (US)
Gerry Bianco, Elgin, IL (US)

Signed and Sealed this
Thirtieth Day of April, 2013

Teresa Stanek Rea
*Acting Director of the United States Patent and Trademark Office*